US005650648A

United States Patent [19]
Kapoor

[11] Patent Number: 5,650,648
[45] Date of Patent: Jul. 22, 1997

[54] INTEGRATED CIRCUIT STRUCTURE HAVING FLOATING ELECTRODE WITH DISCONTINUOUS PHASE OF METAL SILICIDE FORMED ON A SURFACE THEREOF AND PROCESS FOR MAKING SAME

[75] Inventor: Ashok K. Kapoor, Palo Alto, Calif.

[73] Assignee: LSI Logic Corporation, Milpitas, Calif.

[21] Appl. No.: 461,387

[22] Filed: Jun. 5, 1995

Related U.S. Application Data

[62] Division of Ser. No. 239,422, May 6, 1994, Pat. No. 5,498,558.

[51] Int. Cl.$^6$ .................................................. H01L 29/788
[52] U.S. Cl. ........................ 257/316; 257/317; 257/384; 257/388; 257/413
[58] Field of Search .................................. 257/296, 297, 257/298, 299, 300, 306, 307, 308, 309, 315, 316, 317, 318, 319, 320, 321, 322, 384, 388, 412, 413, 761, 763, 764, 766, 768, 769, 770

[56] References Cited

U.S. PATENT DOCUMENTS

| 4,486,769 | 12/1984 | Simko | 257/318 |
|---|---|---|---|
| 4,735,919 | 4/1988 | Faraone | 437/43 |
| 4,957,777 | 9/1990 | Ilderem et al. | 427/55 |
| 5,001,527 | 3/1991 | Hosaka | 357/23.5 |

(List continued on next page.)

FOREIGN PATENT DOCUMENTS

| 0255911 | 2/1988 | European Pat. Off. | 257/768 |
|---|---|---|---|
| 4-199671 | 7/1992 | Japan | 257/763 |
| 6-132493 | 5/1994 | Japan | 257/309 |

OTHER PUBLICATIONS

Ibok, Effiong, et al., "A Characterization of the Effect of Deposition Temperature on Polysilicon Properties", *J. Electrochem. Soc.*, vol. 140, No. 10, Oct. 1993, pp. 2927-2937.

Kamins, T. I., et al., "Interaction Between CVD Tungsten Films and Silicon During Annealing", *J. Electrochem. Soc.*, vol. 133, No. 7, Jul. 1986, pp. 1348-1442.

Nygren, Stefan, et al., "Recrystallization and Grain Growth Phenomena in Polycrystalline Si/CoSi$_2$ Thin-Film Couples", *J. Appl. Phys.*, vol. 68, No. 3, Aug. 1, 1990, pp. 1050-1058.

*Primary Examiner*—Ngân V. Ngô
*Attorney, Agent, or Firm*—John P. Taylor

[57] ABSTRACT

A process is disclosed for forming an integrated circuit device, such as an EPROM device, with a floating gate electrode with a discontinuous phase of metal silicide formed on a surface thereof is described. The process for forming such a discontinuous phase of metal silicide on the surface of a polysilicon floating gate electrode for the device comprises the steps of depositing a first polysilicon layer over a substrate, and preferably over a thin oxide layer on the substrate capable of functioning as a gate oxide; then forming a very thin layer of a silicide-forming metal over the polysilicon layer; and heating the structure sufficiently to cause all of the silicide-forming metal to react with the underlying polysilicon layer to form metal silicide and to coalesce the metal silicide into a discontinuous phase on the surface of the polysilicon layer. When an EPROM device is to be constructed, the process includes the further steps of forming an first insulation layer over the structure; forming a second polysilicon layer over the first insulation layer; and then forming a second insulation layer over the second polysilicon layer. The structure is then patterned to form a dual gate electrode structure with a floating gate and a control gate. After doping of the underlying substrate to form the source and drain regions, a further oxide layer may be formed over the entire structure and contact openings may be cut to the source and drain regions and control gate electrode, thus completing formation of an EPROM device with a floating gate having a discontinuous phase of metal silicide on a surface thereof facing the control gate.

10 Claims, 4 Drawing Sheets

U.S. PATENT DOCUMENTS

| | | | |
|---|---|---|---|
| 5,017,505 | 5/1991 | Fujii et al. | 437/52 |
| 5,057,447 | 10/1991 | Paterson | 437/43 |
| 5,081,066 | 1/1992 | Kim | 437/200 |
| 5,087,583 | 2/1992 | Hanzani | 437/43 |
| 5,110,752 | 5/1992 | Lu | 437/47 |
| 5,182,232 | 1/1993 | Chhabra et al. | 437/200 |
| 5,194,924 | 3/1993 | Komori et al. | 257/316 |
| 5,223,081 | 6/1993 | Doan | 156/628 |
| 5,245,206 | 9/1993 | Chu et al. | 257/309 |
| 5,278,450 | 1/1994 | Wolters et al. | 257/769 |
| 5,320,880 | 6/1994 | Sandhu et al. | 427/578 |
| 5,345,104 | 9/1994 | Pkall et al. | 257/316 |

INTEGRATED CIRCUIT STRUCTURE HAVING FLOATING ELECTRODE WITH DISCONTINUOUS PHASE OF METAL SILICIDE FORMED ON A SURFACE THEREOF AND PROCESS FOR MAKING SAME

CROSS-REFERENCE TO RELATED APPLICATIONS

This application is a division of application Ser. No. 08/239,422, filed May 6, 1994, and now issued as U.S. Pat. No. 5,498,558, on Mar. 12, 1996.

BACKGROUND OF THE INVENTION

1. Field of the Invention

This invention relates to integrated circuit structures formed on a semiconductor wafer. More particularly, this invention relates to an integrated circuit structure having a floating electrode with a discontinuous metal silicide surface formed thereon, and a process for forming same.

2. Description of the Related Art

In the formation of integrated circuit structures on semiconductor wafers, it is sometimes desirable to provide, on a conductive element such as an electrode, a roughened surface with high electric field regions. Such a roughened surface, for example, is useful on the surface of a floating gate facing the control gate in an erasable programmed read only memory (EPROM) device. Such a roughened surface, or asperities, formed on the floating gate of an EPROM device cause a controlled breakdown of the oxide at a lower voltage between the floating gate and the control gate, due to Fowler-Norheim tunneling, rather than a destructive breakdown through the oxide during discharge of the floating gate electrode. However, such formation of a roughened surface of controlled texture and high dielectric field points, for example, on a metal or silicon surface, is not always easily accomplished reliably and reproducibly.

Faraone U.S. Pat. No. 4,735,919; Fujii et at. U.S. Pat. No. 5,017,505; and Hazani U.S. Pat. No. 5,087,583 all teach the formation of a floating gate electrode with a roughened surface thereon. In the Faraone and Hazani patents, a thermal oxide layer is grown on the surface of a polysilicon electrode, resulting in a roughened interface between the thermal oxide layer and the polysilicon. The thermal oxide layer is then removed, leaving a roughened surface on the remaining polysilicon electrode. In the Fujii et al. patent, the roughened surface is formed on the polysilicon by controlling the deposition temperature and a subsequent oxide layer is placed over the roughened polysilicon surface to replicate the roughness in the oxide layer, thereby permitting a subsequent polysilicon layer to be formed over the surfaced-roughened oxide layer to provide a polysilicon layer with its undersurface roughened.

It is also known to form a metal silicide layer over a polysilicon layer to form a roughened surface either in the metal silicide or in the underlying polysilicon layer, when it is desirable to form a capacitor of extended surface area. Lu U.S. Pat. No. 5,110,752 teaches the formation of a roughened polysilicon electrode for use in forming a capacitor of extended surface area. A silicide-forming metal is deposited over a polysilicon layer and the composite layer is then heated to form a metal silicide. The metal silicide is then removed, leaving a roughened surface on the remaining polysilicon layer, which forms one electrode of the capacitor.

Doan U.S. Pat. No. 5,223,081 discloses a process for roughening and increasing the surface area of a silicon or polysilicon substrate of a semiconductor by forming a thin metal layer such as titanium over a substrate which may be silicon or polysilicon; heating the metal layer and substrate sufficiently to cause a chemical reaction between the substrate and the metal layer to form a silicide layer and a thin layer of metal oxide-nitride on the silicide layer; then removing the metal oxide-nitride layer, for example, with a solution of ammonium hydroxide and hydrogen peroxide; and then removing the silicide with an etch such as, for example, an HF acid dip; leaving a rough and irregular surface on the remaining silicon or polysilicon. The resultant roughened surface is said to be useful not only to increase surface area and therefore capacitance of a DRAM storage cell; but also to provide better adhesion for conductors or insulators; to reduce reflective notching in photolithography; and to improve the efficiency of solar cells.

Chhabra et al. U.S. Pat. No. 5,182,232 discloses the texturizing of a surface of a conductive structure to increase the storage capacitance of a capacitor made using the texturized conductive structure as an electrode of the capacitor. A layer of polysilicon is first deposited followed by deposition of a metal silicide layer, preferably a silicon-rich metal silicide. The structure is then annealed to alter the grain size of the metal silicide and create silicon-rich grain boundaries. A wet etch is then conducted to remove the silicon in the grain boundaries thereby texturizing the surface of the remaining metal silicide. The process is said to be directed to a conventional stacked capacitor DRAM fabrication process, or to a variety of semiconductor devices (such as VRAMs or EPROMs) and their subsequent fabrication processes, where polysilicon is used as a semiconductor and a metal silicide may be added to enhance conductivity, such as the capacitor cell plates of a storage capacitor and where it is desirable to have the conductor surface take on a texturized surface.

SUMMARY OF THE INVENTION

The invention comprises an integrated circuit device, such as an EPROM device, having an electrode, such as a floating gate electrode, with a discontinuous metal silicide phase formed on its surface, resulting in the desired asperities on the electrode surface; and a process for forming same. The process for forming such a discontinuous metal silicide phase on the surface of an electrode such as a polysilicon floating gate electrode comprises depositing a first polysilicon layer over a substrate, and preferably over a thin oxide layer on the substrate capable of functioning as a gate oxide; then forming a very thin layer of either a silicide-forming metal or a silicide over the polysilicon layer; and heating the structure sufficiently to cause silicide formed while heating the structure, or the deposited silicide, to coalesce to form a discontinuous phase of metal silicide over the polysilicon layer, resulting in the desired asperities and increased electric field points on the surface of the electrode.

When an EPROM type device is to be constructed, the process includes the further steps of forming an first insulation layer over the structure; forming a second polysilicon layer over the first insulation layer; and then forming a second insulation layer over the second polysilicon layer. The structure is then patterned to form a dual gate electrode structure with a lower floating gate and an upper control gate. After doping of the underlying substrate to form the source and drain regions, a further oxide layer may be formed over the entire structure and contact openings may be cut to the source and drain regions and the control gate electrode, thus completing formation of an EPROM device with a floating gate electrode having a discontinuous metal silicide phase on the surface of the floating gate electrode facing the control gate electrode, resulting in the desired increased electric field points on the surface of the floating gate electrode.

DETAILED DESCRIPTION OF THE INVENTION

The invention comprises a floating electrode type integrated circuit structure with the floating electrode having a discontinuous phase of metal silicide formed on the surface thereof and a process for making same. Such a floating electrode integrated circuit structure having a floating electrode with a discontinuous phase of metal silicide formed on a surface thereof, and the formation of same, will be described below with respect to the formation of an EPROM device, by way of illustration and not of limitation.

The term "discontinuous phase of metal silicide", as used herein, is defined as a surface having coalesced nodules of metal silicide formed thereon resulting in a surface with localized regions where electric fields would be increased by more than 10% above the average electric field, as measured in other portions of the same surface; i.e., a surface in which the electric fields are not homogeneous throughout the surface.

Figure 1:
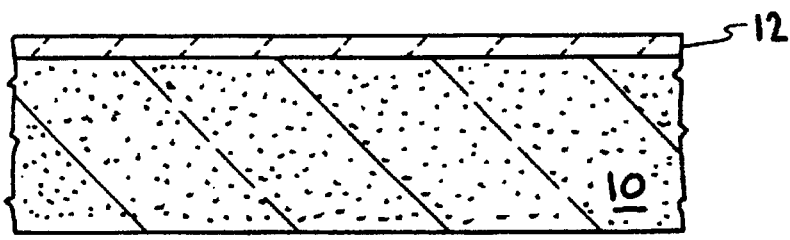
FIGS. 1–10 are fragmentary vertical cross-sectional views which sequentially show the construction of an EPROM integrated circuit structure having a floating electrode with a discontinuous phase of metal silicide formed on the surface thereof facing an upper control electrode.

Turning now to FIG. 1, a semiconductor substrate, which may comprise a silicon wafer, is shown at 10, having a gate oxide (silicon oxide) layer 12 formed thereover, as the initial step in forming an integrated circuit structure incorporating therein the floating electrode having a discontinuous phase of metal silicide thereon of the invention.

Figure 2:
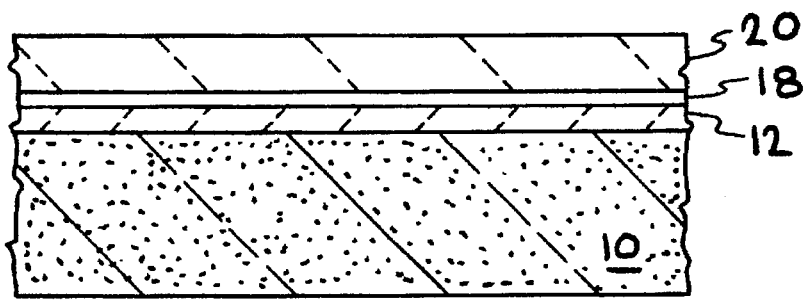

In accordance with the invention, as shown in FIG. 2, a thin layer of polysilicon 18, having a thickness of from about $2 \times 10^{-8}$ meters (200 Angstroms) to about $5 \times 10^{-7}$ meters (5000 Angstroms), is optionally deposited over oxide layer 12 as a seeding layer for further deposition. Next a polysilicon layer 20 is then formed over oxide layer 12. It should be noted that the use of the term "about" herein is intended to indicate a value within ±1%.

Polysilicon layer 20 may be formed over gate oxide layer 12 by any conventional process such as, for example, a CVD process whereby one or more silicon-containing gases are flowed into a vacuum deposition chamber to deposit on a wafer therein. Examples of gases which may be used in such a CVD process to deposit polysilicon include silane ($SiH_4$), disilane ($Si_2H_6$), and dichlorosilane ($SiCl_2H_2$). However, any other process capable of producing a layer of silicon may be used to form polysilicon layer 20.

The thickness of the polysilicon layer will be dependent on the flow rates of the incoming gases, the temperature, pressure, and time of deposition. Preferably, the thickness of the deposited polysilicon layer will vary from about $5 \times 10^{-8}$ meters (500 Angstroms) to about $6 \times 10^{-7}$ meters (6000 Angstroms), and most preferably from about $2 \times 10^{-7}$ meters (2000 Angstroms) to about $4 \times 10^{-7}$ meters (4000 Angstroms), with a typical thickness being about $3 \times 10^{-7}$ meters (3000 Angstroms).

The conductivity of the polysilicon layer may be increased either by adding one or more doping agents, e.g., boron, phosphorous, or arsenic, to the polysilicon as it is formed, or by implanting the polysilicon layer, after formation, with one or more doping agents such as boron, phosphorous, or arsenic. Subsequent annealing to activate the dopant may be carried out at the same time as the control gate electrode is annealed as will be discussed below. The amount of dopant which should be added to the polysilicon layer to render it sufficiently conductive for use as a conductive electrode in an integrated circuit structure will vary from about $10^{19}$ atoms/cm$^3$ to about $10^{21}$ atoms/cm$^3$.

Figure 3:
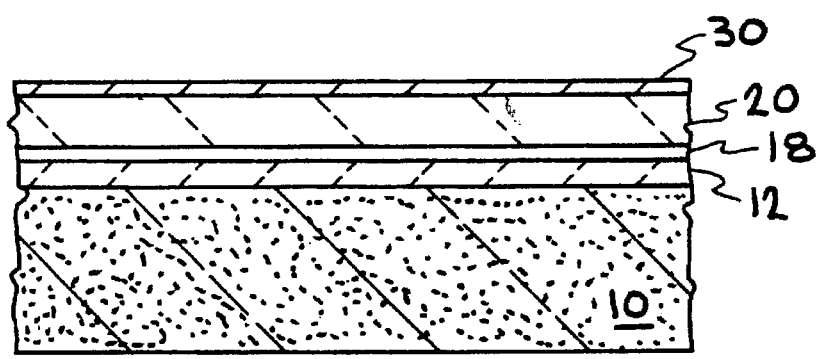

After formation of silicon layer 20 over gate oxide layer 12, in one embodiment, a thin metal layer 30 may be deposited over layer 20, as shown in FIG. 3. Metal layer 30 comprises a metal capable of subsequently reacting with polysilicon layer 20 to form a metal silicide. Such a metal may comprise, for example, a refractory metal such as titanium or tungsten. Examples of other metals capable of reacting with polysilicon to form a silicide which may be deposited include tantalum, niobium, hafnium, molybdenum, cobalt, and nickel. The thickness of metal layer 30 should be less than about $10^{-8}$ meters (100 Angstroms). Preferably the thickness of deposited metal layer 30 will range from about $10^{-9}$ meters (10 Angstroms) to about $5 \times 10^{-9}$ meters (50 Angstroms), and most preferably the thickness of deposited metal layer 30 will range from about $10^{-9}$ meters (10 Angstroms) to about $3 \times 10^{-9}$ meters (30 Angstroms). This control of the thickness of the deposited silicide-forming metal is very important to the practice of the invention, since deposition of a thicker layer of such metal may result in too much metal silicide being formed, which can, in turn, interfere with the subsequent desired coalescence of the metal silicide into the desired discontinuous phase of metal silicide over the underlying surface of silicon.

Figure 4:
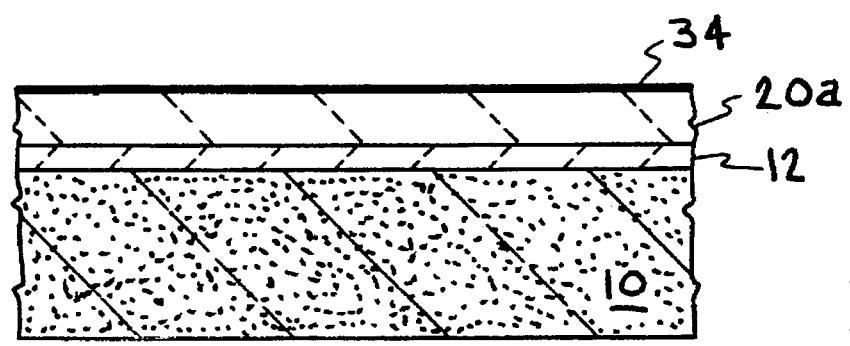

After deposition of the controlled thickness of metal layer 30, the structure may be annealed at a temperature at least sufficiently high to permit metal layer 30 to react with underlying polysilicon layer 20 to form a thin layer 34 of metal silicide over the remainder of polysilicon layer 20, now designated, in FIG. 4, as 20a. It will be appreciated by those skilled in the art that the thickness of metal silicide 34 is controlled by the thickness of deposited metal layer 30. That is, the thinner metal layer 30 is, the thinner metal silicide layer 34 will be, since the silicide-forming reaction ceases when all of metal layer 30 has reacted with the underlying silicon.

The annealing temperature may range from about 500° C. to about 1000° C., but preferably will range from about 600° C. to about 800° C., particularly, for example, when metal layer 30 comprises titanium. The annealing may be carried out for a time period ranging from about 5 minutes to about 2 hours in a conventional annealing furnace. Preferably, however, the annealing is carried out using rapid thermal annealing wherein the substrate is exposed to the annealing temperature for a period of from about 30 seconds to about 2–3 minutes, as is well known to those skilled in the art.

It will be noted that all of the silicide-forming metal in metal layer 30 is used or consumed in the metal silicide formation step. That is, no unreacted metal remains after the anneal, so that only a thin layer 34 of metal silicide is initially formed over remaining polysilicon layer 20a. This is made possible by controlling the thickness of metal layer 30. Control of the thickness of metal layer 30 then results in the formation of a very thin layer of metal silicide which will then, in accordance with the invention, be coalesced into the desired discontinuous phase of metal silicide, as well as assuring complete consumption of all of metal layer 30 during the silicide process, and obviating any need for subsequent removal of all or part of the metal silicide layer. As a result of this formation of a very thin layer of silicide-forming metal, and the resultant consumption of all of the silicide-forming metal comprising deposited metal layer 30, during the silicide-forming annealing step, it is not necessary to subsequently remove any portions of metal silicide layer 34.

Since the purpose of the formation of metal silicide layer 34 on polysilicon layer 20a is to subsequently provide a discontinuous phase of metal silicide 36 over polysilicon layer 20a, not to form a metal silicide layer per se, for example, to improve an electrical contact to a subsequently formed and filled via or contact opening, it is very important that metal layer 30 be formed very thin, as previously discussed. This will result in formation of a very thin metal silicide layer 34, having a thickness ranging from about $25 \times 10^{-10}$ meters (25 Angstroms) to about $250 \times 10^{-10}$ meters (250 Angstroms), and most preferably the thickness of metal silicide layer 34 will range from about $25 \times 10^{-10}$ meters (25 Angstroms) to about $75 \times 10^{-10}$ meters (75 Angstroms). This thin layer of metal silicide will then be coalesced into a discontinuous phase of metal silicide.

In accordance with one embodiment of the process, the structure is then further heated to a temperature at which the thin layer of metal silicide just formed will coalesce into the desired discontinuous phase of metal silicide on the surface of polysilicon layer 20a. The minimum amount of additional heating needed to obtain the desired coalescence will vary with the particular metal silicide, but usually will range from at least about 50° C. to about 300° C. over the minimum silicide-forming temperature. For example, when titanium silicide is formed, the silicide forming temperature ranges from about 600° C. to about 650° C., so the structure should be heated to from about 700° C. to about 900° C. to cause the desired coalescence of the titanium silicide into a discontinuous phase of titanium silicide over the underlying silicon, i.e., nodules of coalesced titanium silicide forming a discontinuous phase or film on the silicon surface.

Figure 5:
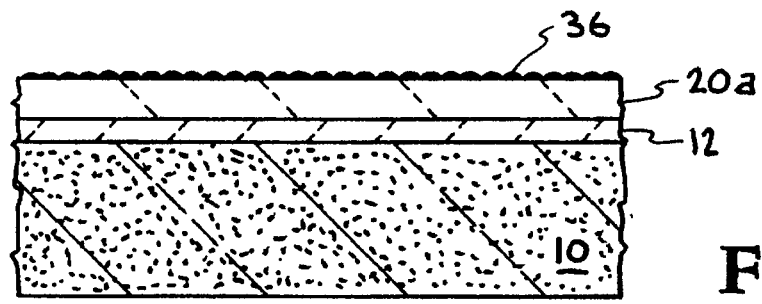

This coalescence of metal silicide layer 34 into a series of discontinuous nodules of titanium silicide on remaining polysilicon layer 20a results in the formation of a discontinuous surface 36 on polysilicon layer 20a, as shown in exaggerated form in FIG. 5.

It should be noted that while the above formation of metal silicide layer 34 and subsequent coalescence of the metal silicide into discontinuous phase 36 on the surface of silicon 20a, the metal silicide formation and coalescence may be carried out in a single step by providing a sufficiently high temperature for the metal silicide formation. For example, when titanium silicide is to be formed, since the silicide forming temperature ranges from about 600° C. to about 650° C., the structure should be heated to from about 700° C. to about 900° C. to cause the desired formation of metal silicide and coalescence of the titanium silicide into a discontinuous phase of titanium silicide over the underlying silicon in a single step.

Since the ultimate purpose of the formation of metal silicide layer 34 is to form a discontinuous surface or phase of metal silicide 36 on remaining underlying polysilicon layer 20a, it is also within the scope of the invention, in another embodiment, to deposit a metal silicide layer per se over polysilicon layer 20 and then to heat the deposited layer of metal silicide sufficiently to cause coalescence of the deposited metal silicide to form the desired discontinuous phase of metal silicide, as discussed above with regard to the previous embodiment.

In this embodiment, the metal silicide would be directly deposited, for example, by a sputtering process, to the same thickness as previously discussed, i.e., a thickness ranging from about $25 \times 10^{-10}$ meters (25 Angstroms) to about $250 \times 10^{-10}$ meters (250 Angstroms), and most preferably the thickness of metal silicide layer 34 will range from about $25 \times 10^{-10}$ meters (25 Angstroms) to about $75 \times 10^{-10}$ meters (75 Angstroms). The deposited metal silicide is then heated to the same temperatures as previously discussed for coalescence of the metal silicide to the desired discontinuous phase of metal silicide.

After either formation or deposition of the thin layer 34 of metal silicide, and coalescence of thin metal silicide layer 34 into discontinuous phase 36 on silicon 20a, an oxide layer 40 may be formed thereon for construction of an integrated circuit structure such as, for example, an EPROM device with a floating gate electrode.

Figure 6:
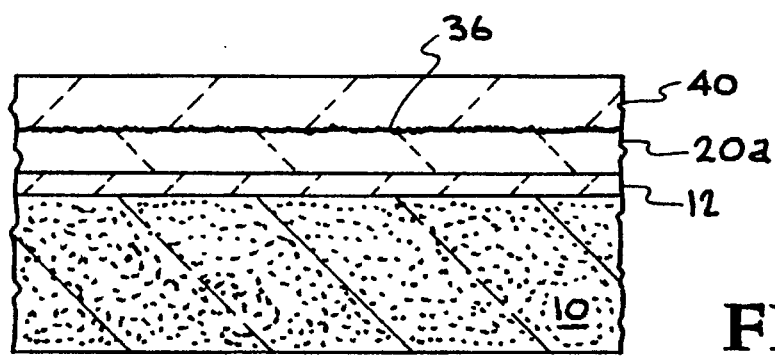

Oxide layer 40 may be formed, for example, by a CVD process, to a thickness ranging from about $2 \times 10^{-8}$ meters (200 Angstroms) to about $2 \times 10^{-7}$ meters (2000 Angstroms), as shown in FIG. 6. Any conventional oxide deposition process may be used to deposit oxide layer 40 over discontinuous metal silicide phase 36 and polysilicon layer 20a.

Figure 7:
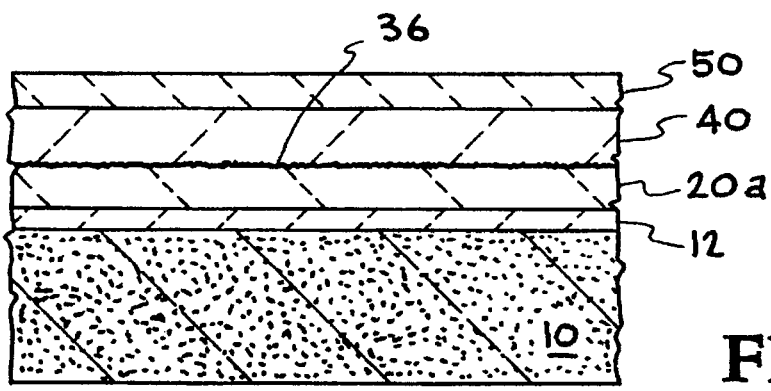

After formation of deposited oxide layer 40 over discontinuous metal silicide phase 36 and polysilicon layer 20a, a further conductive layer 50 may be formed over oxide layer 40, as shown in FIG. 7. Layer 50 will be used to form the control gate of the EPROM device. Conductive layer 50 may comprise a further polysilicon layer appropriately doped to provide sufficient conductivity for the subsequently formed control gate to function properly.

Polysilicon layer 50 is deposited to a thickness which may range from about $10^{-7}$ meters (1000 Angstroms) to about $6 \times 10^{-7}$ meters (6000 Angstroms), preferably from about $2 \times 10^{-7}$ meters (2000 Angstroms) to about $4 \times 10^{-7}$ meters (4000 Angstroms), and typically about $3 \times 10^{-7}$ meters (3000 Angstroms).

Figure 8:
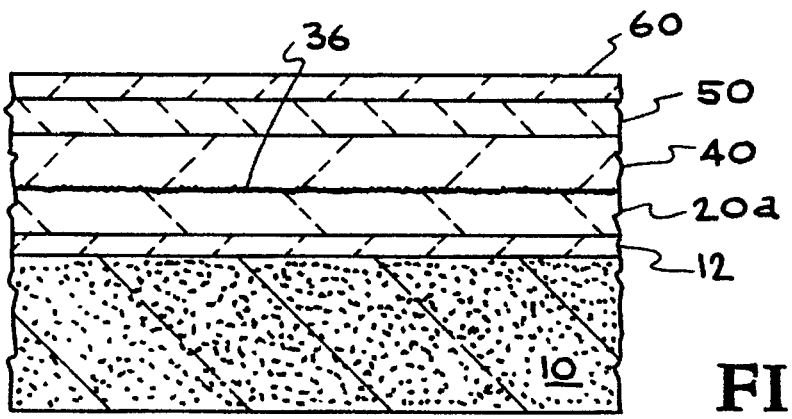

After formation of polysilicon layer 50 over the structure, a further protective or insulating layer 60 may be deposited by any suitable process over polysilicon layer 50, as shown in FIG. 8. Protective layer 60 may comprise at least about $2 \times 10^{-8}$ meters (200 Angstroms) of a protective layer of an insulation material, such as, for example, oxide or nitride, to protect the structure prior to further processing.

Figure 9:
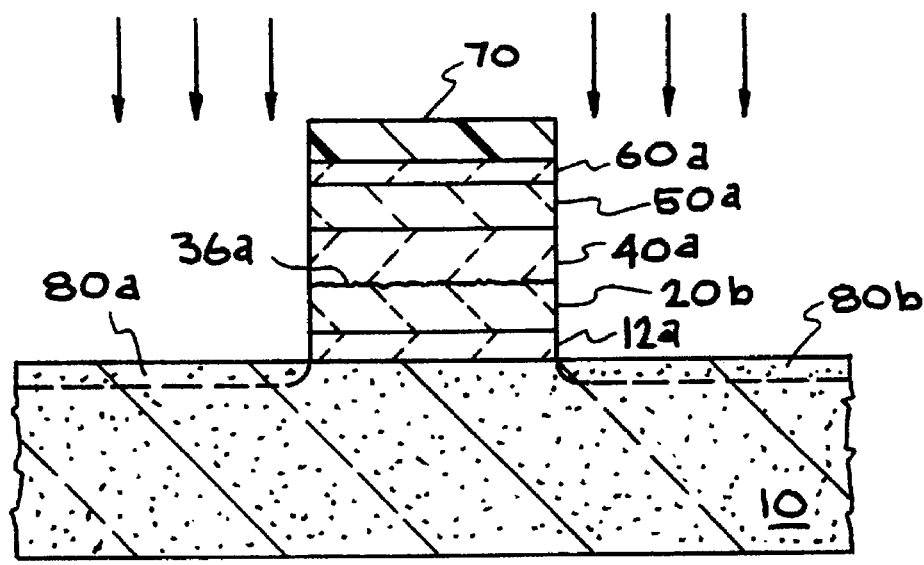

Subsequently, as shown in FIG. 9, the structure may be patterned, using a photoresist mask 70, to remove selected portions of layers 12, 20a, 40, 50, and 60, thereby exposing substrate 10. These exposed portions of substrate 10 may then be conventionally implanted, as shown in FIG. 9, e.g., with arsenic or phosphorus, to form source region 80a and drain region 80b in substrate 10 adjacent gate oxide portion 12a, floating electrode 20b (with discontinuous metal silicide 36a thereon), oxide portion 40a, control electrode 50a, and insulating portion 60a which remain after the patterning step. For devices with small channel lengths, lightly doped drains (LDD) may also be formed, as is known to those skilled in the art.

Figure 10:
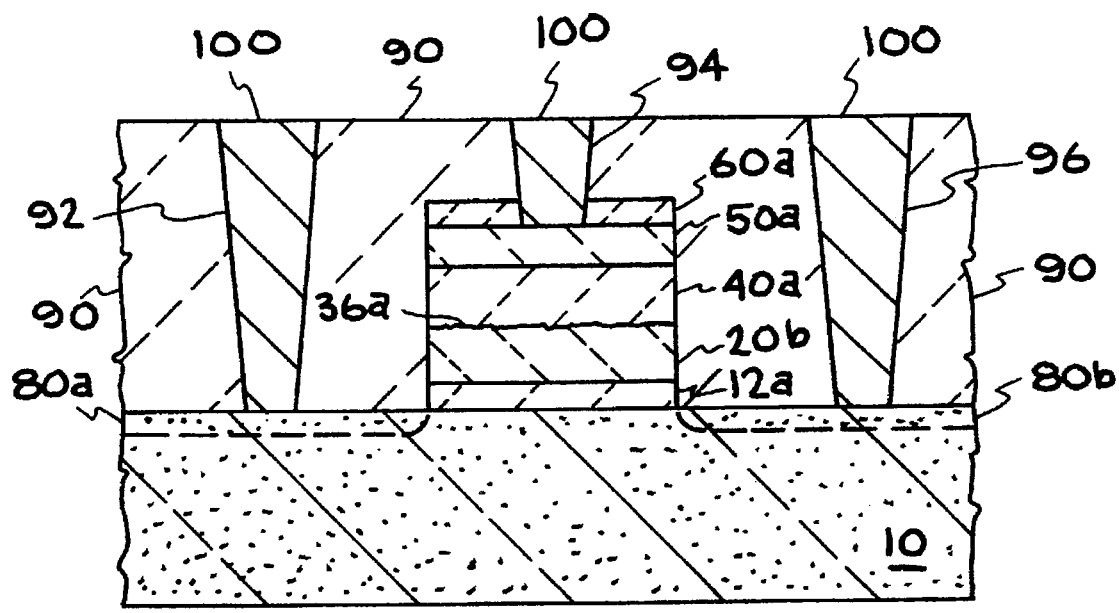
Figure 11:
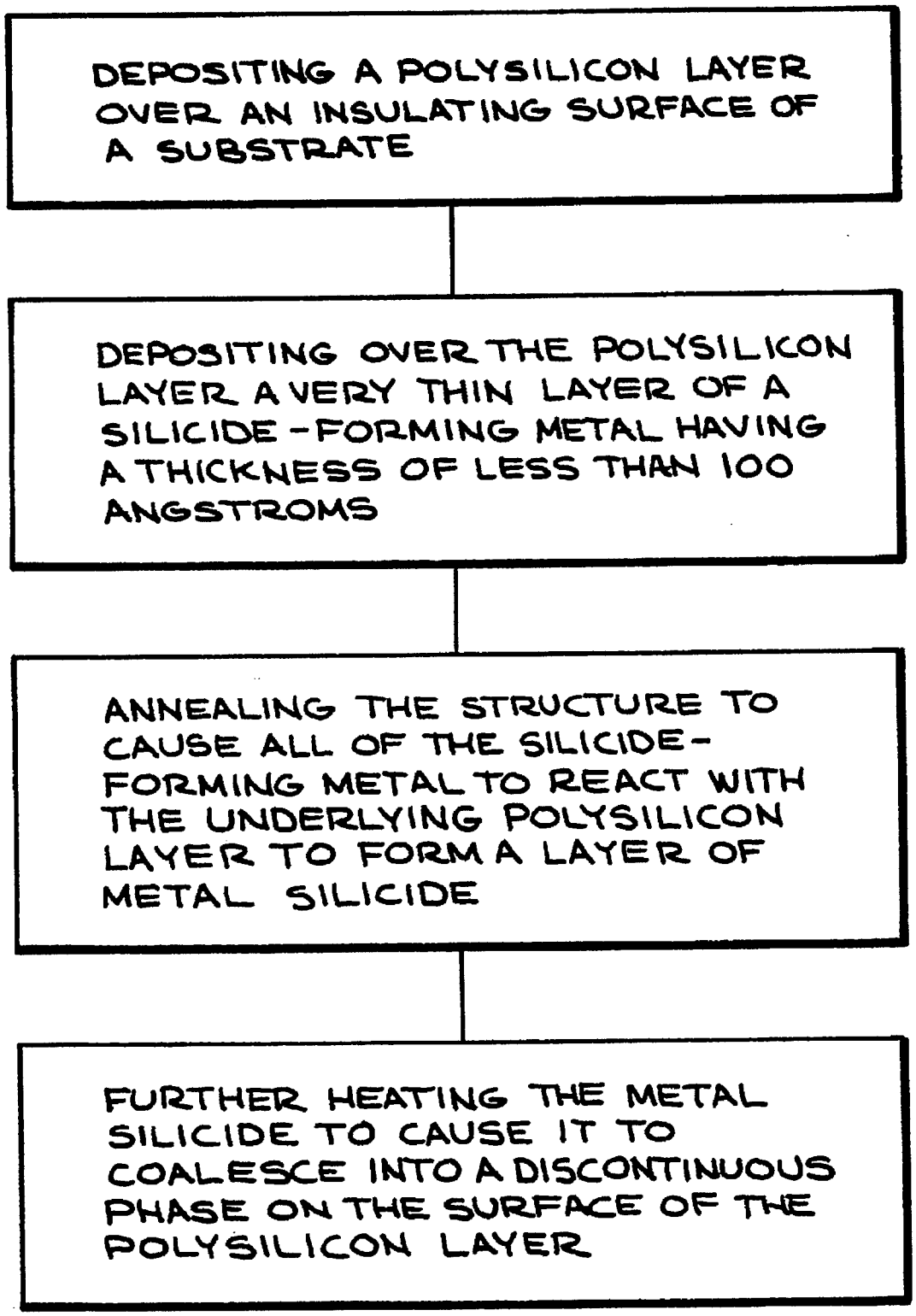
FIG. 11 is a flow sheet illustrating the process of the invention.

The EPROM device of the invention may then be conventionally completed, for example, by the deposition of an insulation layer 90 over the structure followed by the formation of contact openings 92, 94, and 96 therein, respectively to source region 80a, control gate electrode 50a, and drain region 80b; and the filling of contact openings 92, 94, and 96 with a conductive filler material 100, such as, for example, doped polysilicon or tungsten, resulting in the structure shown in FIG. 10.

Thus, the invention provides an electrode, such as, for example, a conductive floating gate electrode, with a surface comprising a discontinuous phase of metal silicide thereon for use in the construction of an integrated circuit structure such as an EPROM type device. The conductive member is formed, in one embodiment, using polysilicon and a very thin layer of silicide-forming metal deposited over the polysilicon, resulting in the formation of a thin layer of metal silicide on the surface when the structure is subsequently subject to an anneal, by, reaction of all of the silicide-forming metal with the underlying polysilicon layer. This thin layer of metal silicide, upon further heating, then coalesces to form the desired discontinuous phase of metal silicide on the polysilicon surface. By controlling the amount of silicide-forming metal deposited, the thickness of the resulting metal silicide is controlled, and the need for subsequent removal of any of the formed metal silicide, together with unreacted metal, is eliminated.

In another embodiment, the conductive member is formed by direct deposit of a thin layer of metal silicide deposited over the polysilicon resulting in the formation of a discontinuous phase of metal silicide on the surface when the structure is then heated to the coalescence temperature of the metal silicide.

Having thus described the invention what is claimed is:

1. An integrated circuit structure having a floating gate electrode with a discontinuous phase of metal silicide on a surface thereof formed by:
   a) depositing a first polysilicon layer over a first oxide layer on a substrate;
   b) forming over said polysilicon layer a layer of a metal silicide sufficiently thin to result in coalescence of said metal silicide into said discontinuous phase upon subsequent heating thereof; and
   c) heating said structure sufficiently to cause said metal silicide to coalesce into said discontinuous phase on the surface of said underlying polysilicon layer.

2. The structure of claim 1 wherein said integrated circuit structure having said floating gate electrode with said discontinuous phase of metal silicide on said surface of said underlying polysilicon layer comprises an EPROM device formed by the further steps of:
   a) forming a first insulation layer over the structure;
   b) forming a second polysilicon layer over said first insulation layer;
   c) then forming a second insulation layer over said second polysilicon layer;
   d) then patterning said structure to form a dual gate electrode structure with a floating gate electrode formed from said first polysilicon layer and a control gate electrode formed from said second polysilicon layer;
   e) doping said substrate to form source and drain regions;
   f) forming a third insulation layer over the resulting structure; and
   g) forming contact openings through said third insulation layer to said source and drain regions and through both said third insulation layer and said second insulation layer to said control gate electrode;

to thereby form said EPROM device characterized by said floating gate electrode having said discontinuous phase of metal silicide formed on said surface of said floating gate electrode facing said control gate electrode.

3. The integrated circuit structure of claim 1 wherein said first oxide layer is present beneath said first polysilicon layer.

4. The integrated circuit structure of claim 3 where a discontinuous phase of metal silicide comprises coalesced nodules of metal silicide formed on said surface of said first polysilicon layer resulting in said surface on said first polysilicon layer having localized regions where electric fields are increased by more than 10% above the average electric field, as measured in other portions of the same surface.

5. The integrated circuit structure of claim 3 where said discontinuous phase of metal silicide comprises coalesced nodules of metal silicide formed on a surface of said first polysilicon layer resulting in said surface of said first polysilicon layer comprising a surface in which electric fields are not homogeneous throughout said surface.

6. The integrated circuit structure of claim 3 wherein said first polysilicon layer having said discontinuous phase of metal silicide formed on a surface of said first polysilicon layer has a second oxide layer formed over said surface of said first polysilicon layer and said discontinuous phase of metal silicide thereon.

7. The integrated circuit structure of claim 6 wherein said structure further comprises a second layer of polysilicon formed over said second oxide layer.

8. The integrated circuit structure of claim 7 wherein said structure further comprises an insulation layer formed over said second layer of polysilicon.

9. An integrated circuit structure including a dual gate electrode structure comprising:
   a) a first oxide layer;
   b) a first polysilicon layer formed over said first oxide layer, said first polysilicon layer:
      i) having a discontinuous phase of metal silicide formed on a surface of said first polysilicon layer; and
      ii) patterned to form a floating gate electrode;
   c) a second oxide layer formed over said surface of said first polysilicon layer and said discontinuous phase of metal silicide thereon;
   d) a second layer of polysilicon formed over said second oxide layer, said second layer of polysilicon patterned to form a control gate electrode;
   e) an insulation layer formed over said second layer of polysilicon;

wherein said first polysilicon layer having a discontinuous phase of metal silicide formed on said surface of said first polysilicon layer comprises said floating gate electrode having a roughened surface thereon facing a surface of said control gate electrode.

10. An integrated circuit structure comprising:
   a) a first oxide layer;
   b) a first polysilicon layer on said first oxide layer;
   c) a discontinuous phase of metal silicide formed on a surface of said first polysilicon layer;
   d) a second layer of oxide formed over said surface of said first polysilicon layer and said discontinuous phase of metal silicide;
   e) a second layer of polysilicon formed over said second oxide layer; and f) an insulation layer formed over said second layer of polysilicon;

wherein said structure further comprises said first and second polysilicon layers patterned to form a dual gate electrode structure with said patterned first polysilicon layer forming a floating gate electrode and said patterned second polysilicon layer forming a control gate electrode, said surface of said patterned first polysilicon layer forming said floating gate electrode facing said control gate electrode having said discontinuous phase of said metal silicide thereon so that a roughened surface of said floating gate electrode faces said control gate electrode.

* * * * *

UNITED STATES PATENT AND TRADEMARK OFFICE
CERTIFICATE OF CORRECTION

PATENT NO. : 5,650,648
DATED : July 22, 1997
INVENTOR(S) : Ashok K. Kapoor

It is certified that error appears in the above-indentified patent and that said Letters Patent is hereby corrected as shown below:

Title Page:

Item [56], References Cited, Other Publications, line 6, change "pp. 1348-1442" to "pp. 1438-1442".

Title Page:

Item [57], Abstract, line 4, after "surface thereof", delete "is described".

Item [57], Abstract, line 17, change "an" to "a".

Page 2:

U.S. Patent Documents, Col. 1, line 4, change "Hanzani" to "Hazani".

U.S. Patent Documents, Col. 2, line 7, change "Pkall" to "Prall".

Col. 8, line 8, Claim 4, change "a" to "said".

Col. 8, line 10, Claim 4, change "said" to "a".

UNITED STATES PATENT AND TRADEMARK OFFICE
CERTIFICATE OF CORRECTION

PATENT NO. : 5,650,648
DATED : July 22, 1997
INVENTOR(S) : Ashok K. Kapoor

It is certified that error appears in the above-indentified patent and that said Letters Patent is hereby corrected as shown below:

Col. 8, line 49, Claim 9, after "electrode;", insert "and".

Signed and Sealed this

Sixteenth Day of September, 1997

BRUCE LEHMAN

Attest:

Attesting Officer

Commissioner of Patents and Trademarks